United States Patent
Malone et al.

(10) Patent No.: US 7,002,799 B2
(45) Date of Patent: Feb. 21, 2006

(54) EXTERNAL LIQUID LOOP HEAT EXCHANGER FOR AN ELECTRONIC SYSTEM

(75) Inventors: Christopher G. Malone, Loomis, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/828,448

(22) Filed: Apr. 19, 2004

(65) Prior Publication Data

US 2005/0231913 A1    Oct. 20, 2005

(51) Int. Cl.
*H05K 7/20*    (2006.01)

(52) U.S. Cl. ............... 361/699; 361/695; 361/704; 174/15.1; 165/80.4

(58) Field of Classification Search ........... 361/677, 361/678, 687–690, 694–704; 174/15.1, 15.2; 165/80.4, 104.33; 62/259.2
See application file for complete search history.

(56) References Cited

U.S. PATENT DOCUMENTS

| | | | |
|---|---|---|---|
| 5,020,586 A | 6/1991 | Mansingh | |
| 5,131,233 A | 7/1992 | Cray et al. | |
| 5,203,399 A * | 4/1993 | Koizumi | 165/104.33 |
| 5,285,347 A * | 2/1994 | Fox et al. | 361/699 |
| 5,293,930 A | 3/1994 | Pitasi | |
| 5,731,954 A * | 3/1998 | Cheon | 361/699 |
| 6,351,381 B1 | 2/2002 | Bilski et al. | |
| 6,377,453 B1 | 4/2002 | Belady | |
| 6,437,982 B1 * | 8/2002 | Cardenas | 361/700 |
| 6,496,386 B1 | 12/2002 | Warzecha et al. | |
| 6,529,377 B1 | 3/2003 | Somadder et al. | |
| 6,536,516 B1 | 3/2003 | Davies et al. | |
| 6,591,898 B1 * | 7/2003 | Chu et al. | 165/80.4 |
| 6,628,520 B1 | 9/2003 | Patel et al. | |
| 6,643,132 B1 * | 11/2003 | Faneuf et al. | 361/700 |
| 6,778,394 B1 * | 8/2004 | Oikawa et al. | 361/700 |
| 6,795,316 B1 * | 9/2004 | Owens et al. | 361/704 |
| 6,856,037 B1 * | 2/2005 | Yazawa et al. | 290/43 |
| 6,856,509 B1 * | 2/2005 | Lin | 361/685 |
| 2004/0008483 A1 * | 1/2004 | Cheon | 361/687 |
| 2004/0057211 A1 * | 3/2004 | Kondo et al. | 361/696 |

* cited by examiner

*Primary Examiner*—Boris Chérvinsky

(57) ABSTRACT

A cooling apparatus for usage in an electronic system, a liquid loop heat exchanger body is configured for attachment to an exterior surface of an electronic system chassis.

21 Claims, 10 Drawing Sheets

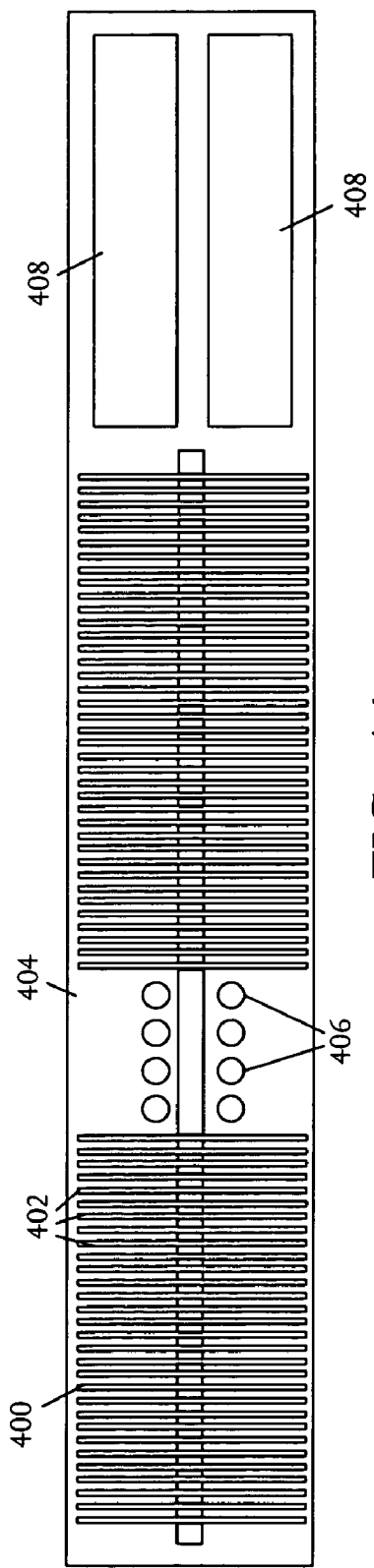
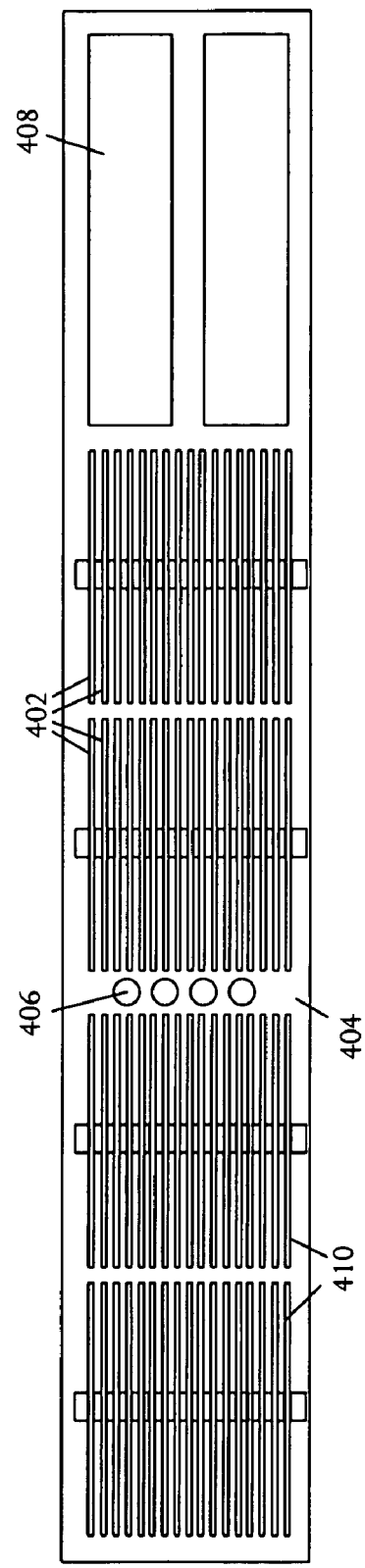
FIG. 4A
FIG. 4B

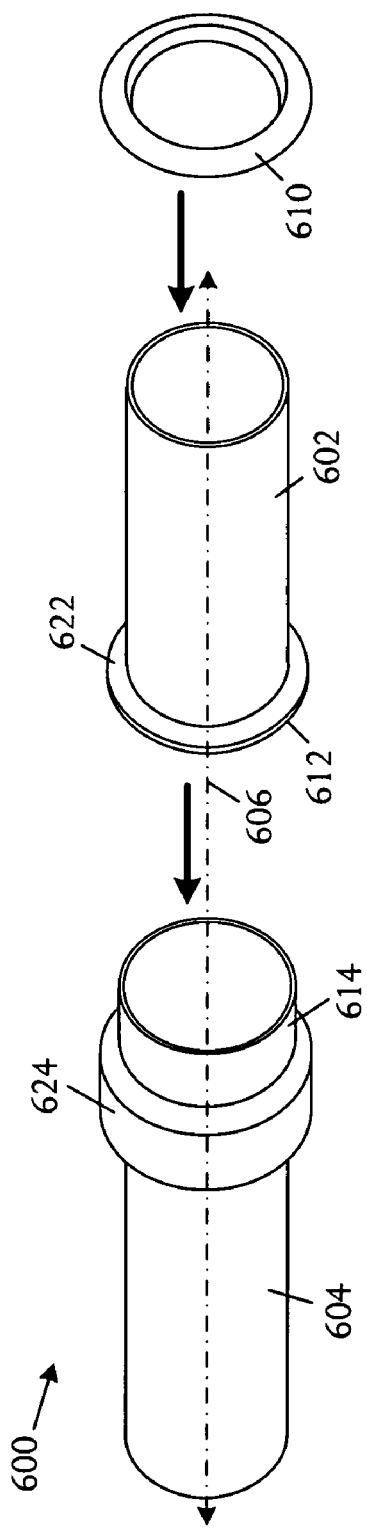
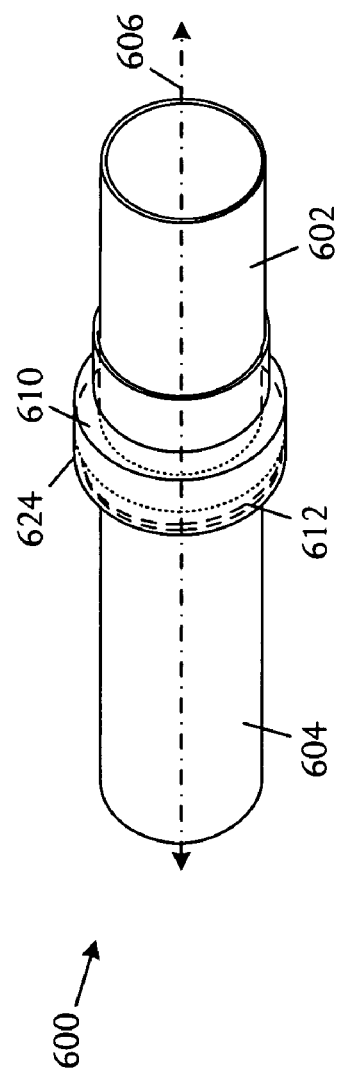
FIG. 6A
FIG. 6B

EXTERNAL LIQUID LOOP HEAT EXCHANGER FOR AN ELECTRONIC SYSTEM

BACKGROUND OF THE INVENTION

Electronic systems and equipment such as computer systems, network interfaces, storage systems, and telecommunications equipment are commonly enclosed within a chassis, cabinet or housing for support, physical security, and efficient usage of space. Electronic equipment contained within the enclosure generates a significant amount of heat. Thermal damage may occur to the electronic equipment unless the heat is removed.

Compact electronic systems and devices, for example compact computer servers with a rack-mount 1U form factor, typically have very little space available for implementing a cooling capability. Conventional air-cooled heat sinks generally must be directly connected to the heat source. The footprint of the heat sink cannot be much larger than the heat source given the intrinsic heat spreading resistance of an aluminum or copper heat sink. Given the restriction on heat sink height dictated by the form factor and the practical limits on heat sink footprint, cooling capabilities are highly restricted.

SUMMARY

In accordance with an embodiment of a cooling apparatus for usage in an electronic system, a liquid loop heat exchanger body is configured for attachment to an exterior surface of an electronic system chassis.

BRIEF DESCRIPTION OF THE DRAWINGS

Embodiments of the invention relating to both structure and method of operation, may best be understood by referring to the following description and accompanying drawings.

FIGS. 4A and 4B are perspective pictorial views showing embodiments of heat exchangers arranged to complement various chassis structures such as indicator lights and access doors.

FIGS. 6A, 6B, and 6C are schematic pictorial diagrams illustrating an embodiment of a suitable hinge for usage in a heat exchanger body.

DETAILED DESCRIPTION

Figure 1:
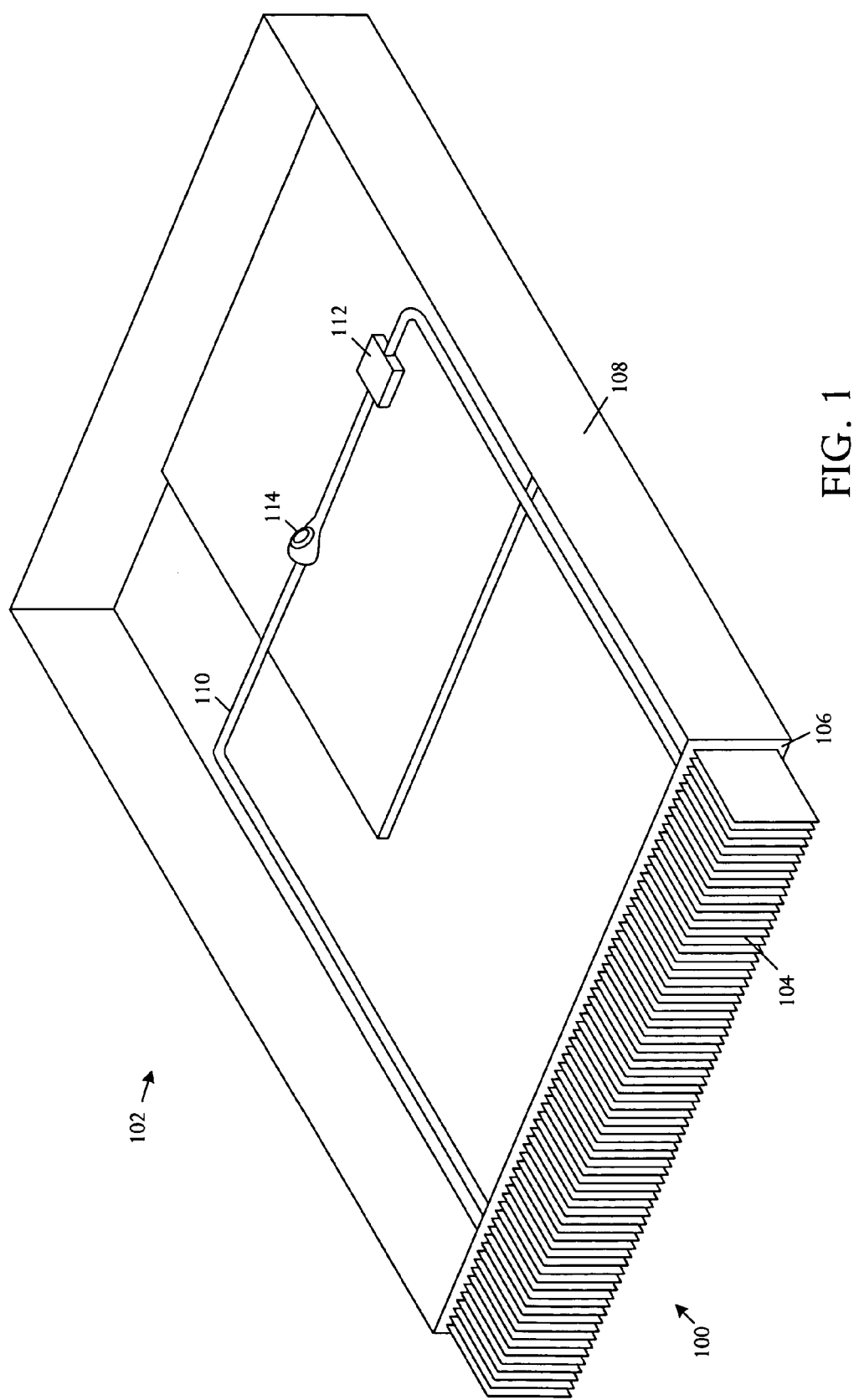
FIG. 1 is a perspective pictorial diagram showing a cooling apparatus for usage in an electronic system.

Referring to FIG. 1, a perspective pictorial diagram depicts a cooling apparatus 100 for usage in an electronic system 102 comprises a liquid loop heat exchanger body 104 is configured for attachment to an exterior surface 106 of an electronic system chassis 108.

The cooling apparatus 100 may further include a tube 110 capable of enclosing a cooling fluid. The tube 110 extends in a loop that passes interiorly though the heat exchanger body 104 external to the electronic system chassis 108 and also passes into the chassis 108 to cooling plates 112 coupled to electronic components interior to the electronic system chassis 108. The cooling apparatus 100 may also have a pump 114 coupled into the tube 110 that is capable of generating a pressure head suitable to drive the cooling fluid interior to the tube 110 through the loop interior and exterior of the chassis 108.

Electronic system architectures such as server architectures with a compact form factor may include the liquid loop cooling apparatus 100 to accommodate increasing power and power density levels of components including microprocessors and associated electronics. The liquid loop cooling apparatus 100 uses the pump 114 to drive the cooling fluid through high pressure-drop channels of the cold plates 112 attached to processors and other high-power components. The pump 114 also drives the cooling fluid along a potentially long and narrow-diameter tube 110 that completes the loop between the cold plates 112, the heat exchanger 104, and the pump 114. Forced-air convection at the heat exchanger 104 removes heat from the loop.

The heat exchanger 104 is located exterior to the electronic system chassis 108. In some embodiments, the heat exchanger 104 is located on a frontal surface of the chassis 108, for example either behind a traditional computer bezel or as a replacement to the bezel. In the illustrative embodiment, the heat exchanger body 104 is adapted to mount on the frontal exterior surface of the chassis 108, a useful configuration for locating the liquid loop heat exchanger on a rack-mounted chassis. In other embodiments, the heat exchanger can be positioned on other external surfaces of the chassis or positioned at a distance from the chassis. Positioning of the heat exchanger body 104 exterior to a chassis, for example for usage with a compact form-factor computer server chassis, enables the heat exchanger to have physical dimensions that are larger than can be contained within the chassis.

The electronic system 102 may be any type of device or combination of devices that includes possibly heat-generating components within a chassis 108, housing, or other suitable container. Typical types of electronic systems 102 include computer systems, servers, host systems, storage devices such as one or more of various types of disk storage systems including compact disks (CDs), Digital Versatile Disks (DVDs), hard disks and the like. Other types of electronic system 102 include communication systems or devices, routers, blades, application control devices, and devices for many other applications.

Commonly the chassis 108 is a sheet metal chassis, although in some embodiments, the chassis may be constructed from other materials such as plastics and the like.

Figure 2A:
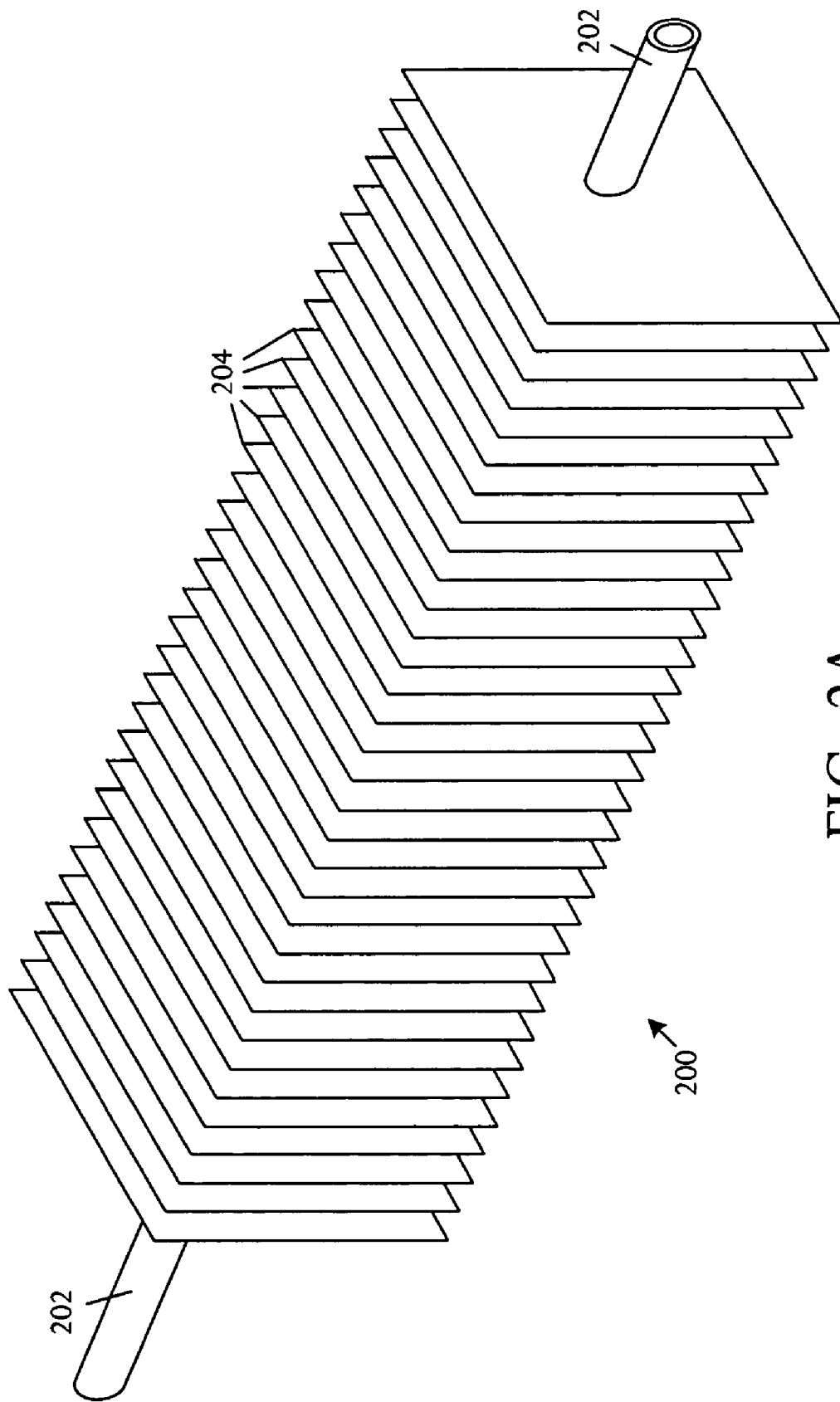
FIGS. 2A, 2B, and 2C are schematic pictorial diagrams illustrating various embodiments of suitable heat exchanger bodies.
Figure 2B:
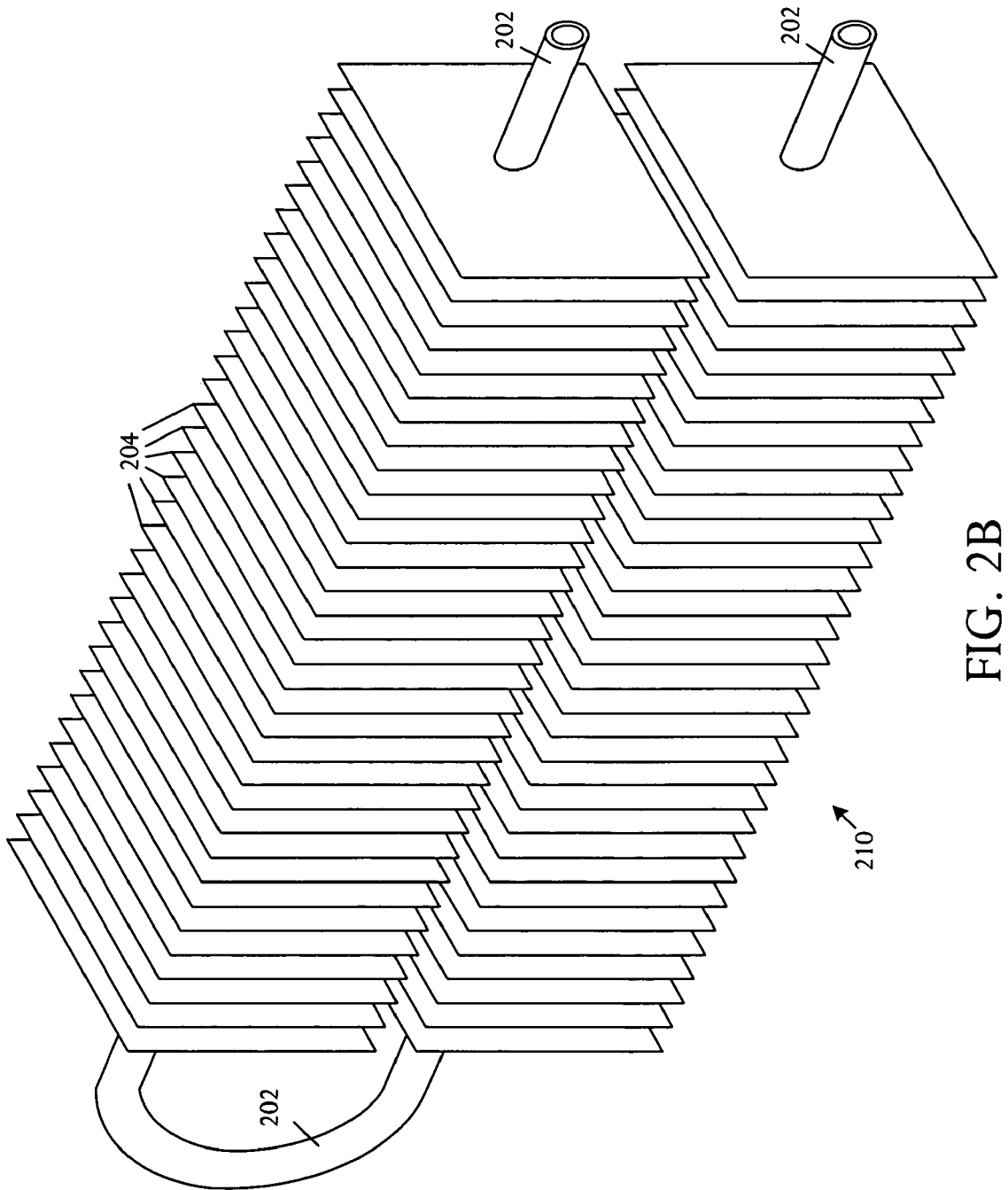
Figure 2C:
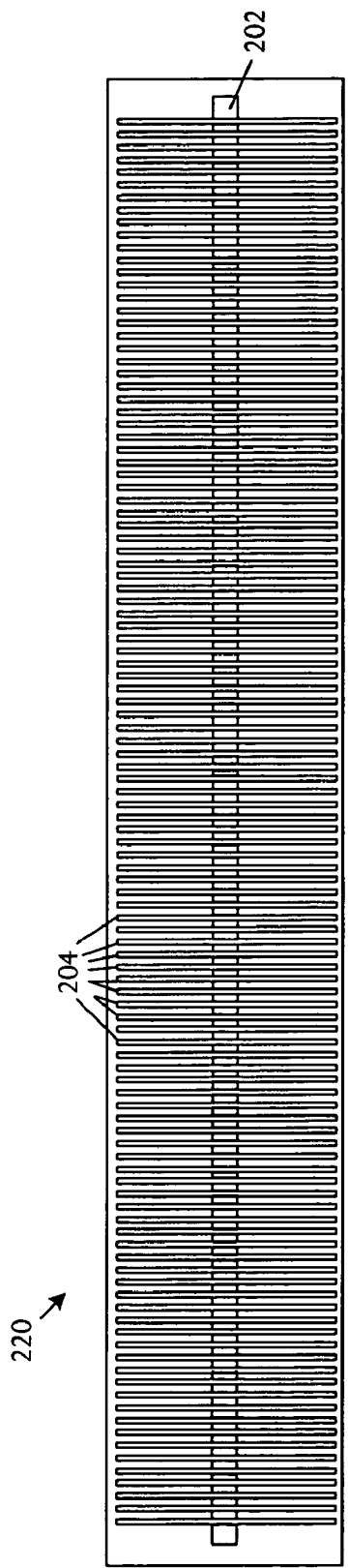

Referring to FIGS. 2A, 2B, and 2C, three schematic pictorial diagrams illustrate various embodiments of suitable heat exchanger bodies 200, 210, and 220, respectively. The illustrative heat exchanger bodies include at least one tube segment 202 that encloses a cooling fluid for circulation through the tubing loop. The tube segment or segments 202 are positioned interior to the heat exchanger body 200, 210, and 220. The heat exchanger bodies 200, 210, and 220 also have a plurality of fins 204 that can be configured in a stack of closely-spaced plates attached to the tube segments 202.

Referring to FIG. 2A, a perspective pictorial diagram illustrates an embodiment of a single-pass heat exchanger 210 that includes a plurality of fins 204 attached to the tube 202 containing cooling fluid. As shown in FIG. 2B, the tube 202 may pass through a fin bank 204 multiple times and in various orientations to attain improved or optimized cooling performance. FIG. 2C is a frontal pictorial view that illustrates an embodiment of a single-pass heat exchanger 220 including multiple fins 204 attached to a tube 202.

Figure 3:
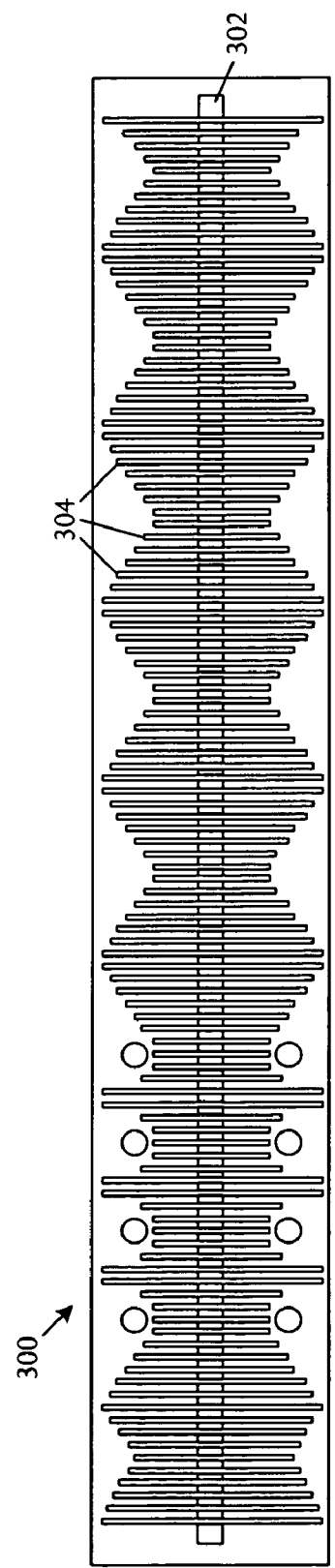
FIG. 3 is a frontal pictorial view illustrating an embodiment of a heat exchanger with an ornamental shape.

Referring to FIG. 3, a frontal pictorial view illustrates an embodiment of a heat exchanger 300 with an ornamental shape. The heat exchanger 300 is positioned exterior to an electronic system chassis and includes a tube segment 302 that can enclose a cooling fluid. The tube segment 302 is positioned interior to the heat exchanger body 300. The heat exchanger 300 further includes a plurality of fins 304 configured in an ornamental arrangement and attached to the tube segment 302 at the frontal surface of the electronic system chassis.

Positioning the heat exchanger 300 on the front of a system chassis may enable elimination of a bezel, often constructed from plastic, which is traditionally mounted to electronic systems, such as computer systems. The fins 304 may be arranged to attain an attractive appearance to attain the ornamental purpose of the bezel, while adding system cooling functionality. In various embodiments, ornamental structures can be formed by arranging the fins 304 horizontally, vertically, or at an angle, or by including fins with multiple various orientations. The fins 304 may be configured with varying pitch, height, width, color, texture, and the like.

Referring to FIGS. 4A and 4B, two perspective pictorial views show embodiments of heat exchangers arranged to complement various chassis structures such as indicator lights and access doors. Fins 402 of a heat exchanger body 400 can be variable in width and height along a surface of the electronic system chassis 404 to accommodate indicator lights 406, access to removable input/output devices 408, and/or labeling. The fins 402 may be interrupted in various places along the length of the heat exchanger 400 also to accommodate input/output access doors, indicator lights, ornamental and other labeling, displays, switches, buttons, and the like. FIG. 4A shows an example of a heat exchanger 400 with vertically-aligned fins 402. FIG. 4B shows a heat exchanger 410 with horizontally-aligned fins 402.

Figure 5A:
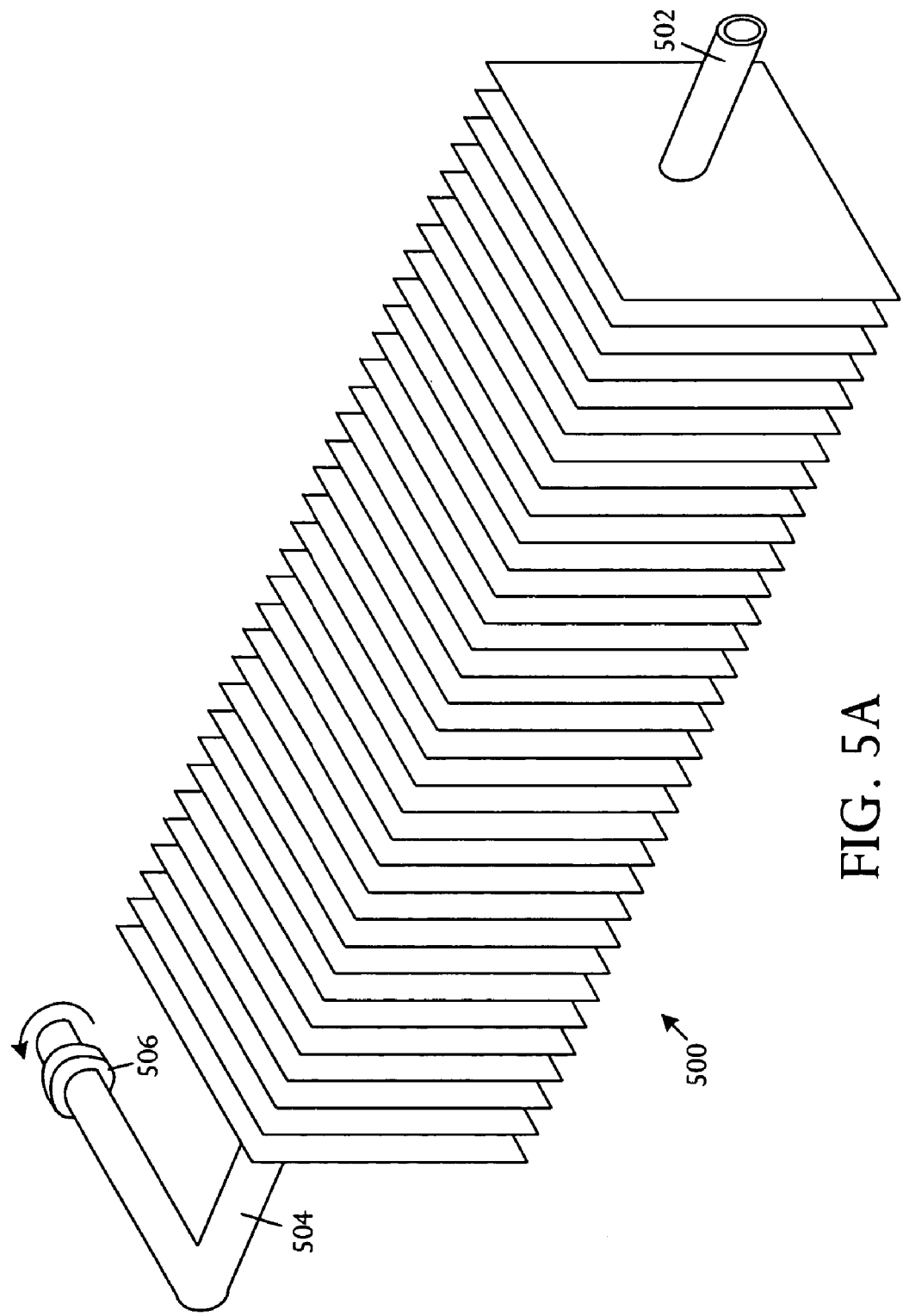
FIGS. 5A and 5B are perspective pictorial views showing embodiments of hinged heat exchangers that enable movement of the heat exchangers away from the chassis for system access.
Figure 5B:
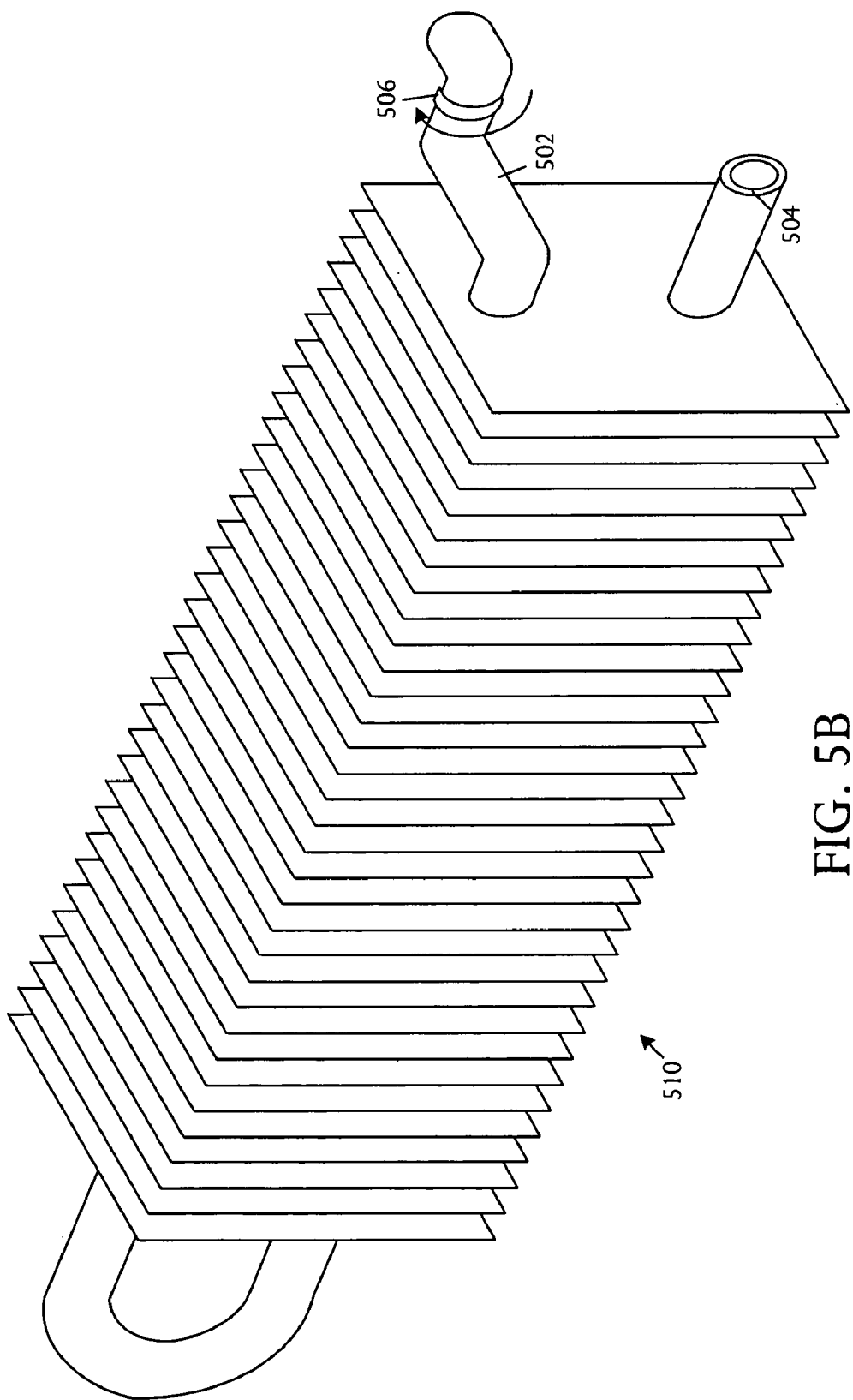

Referring to FIGS. 5A and 5B, two perspective pictorial views show embodiments of hinged heat exchangers 500 and 510, respectively, which enable movement of the heat exchangers away from the chassis for system access. The heat exchangers 500 and 510 include an inlet tube 502 and an outlet tube 504 coupled to the heat exchanger body and hinges 506 coupled to at least one of the inlet tube 502 and outlet tube 504 enabling the heat exchanger body to be rotated away from the electronic system chassis for repairs, insertion and removal of input/output media, and other user and/or service access.

Figure 6C:
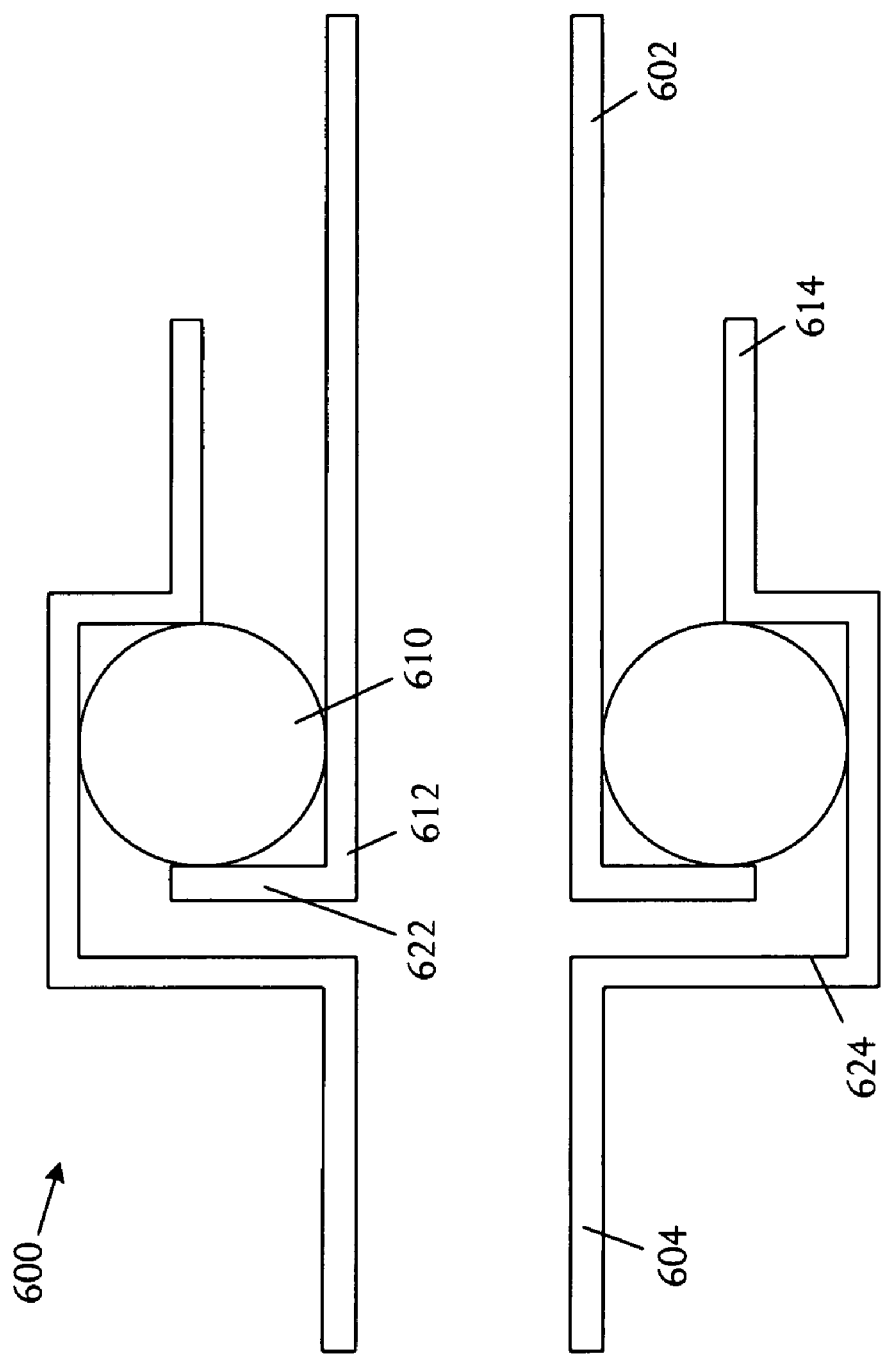

Referring to FIGS. 6A, 6B, and 6C, several schematic pictorial diagrams illustrate an embodiment of a suitable hinge for usage in a heat exchanger body. FIG. 6A is a perspective pictorial diagram showing separated parts of an embodiment of a cylindrical tubing hinge 600 that extends around and couples two segments 602, 604 of a rigid or semi-rigid tubing and enables radial motion of one segment relative to the other. The tubing hinge 600 includes the first and second tubing segments 602, 604 that can be arranged to share a common longitudinal axis 606. The tubing segments 602, 604 terminate in respective first and second tube ends 612, 614. A raised lip 622 on the first tube end 612 extends radially outward relative to the longitudinal axis 606. A raised groove 624 on the second tube end 614 extends radially outward and returns radially inward relative to the longitudinal axis 606 in a longitudinal section of the second tubing segment 604. An O-ring 610 encircles a longitudinal segment of the first tube 602 adjacent and restrained by the raised lip 622 and contained within the raised groove 624 of the second tube end 614.

FIG. 6B is a perspective pictorial diagram showing the combined hinge 600. The first tube end 612 is inserted into the second tube end 614 so that the first tube end raised lip 622 is confined within the second tube end raised groove 624. FIG. 6C is a side sectional view of the hinge embodiment 600.

Figure 7:
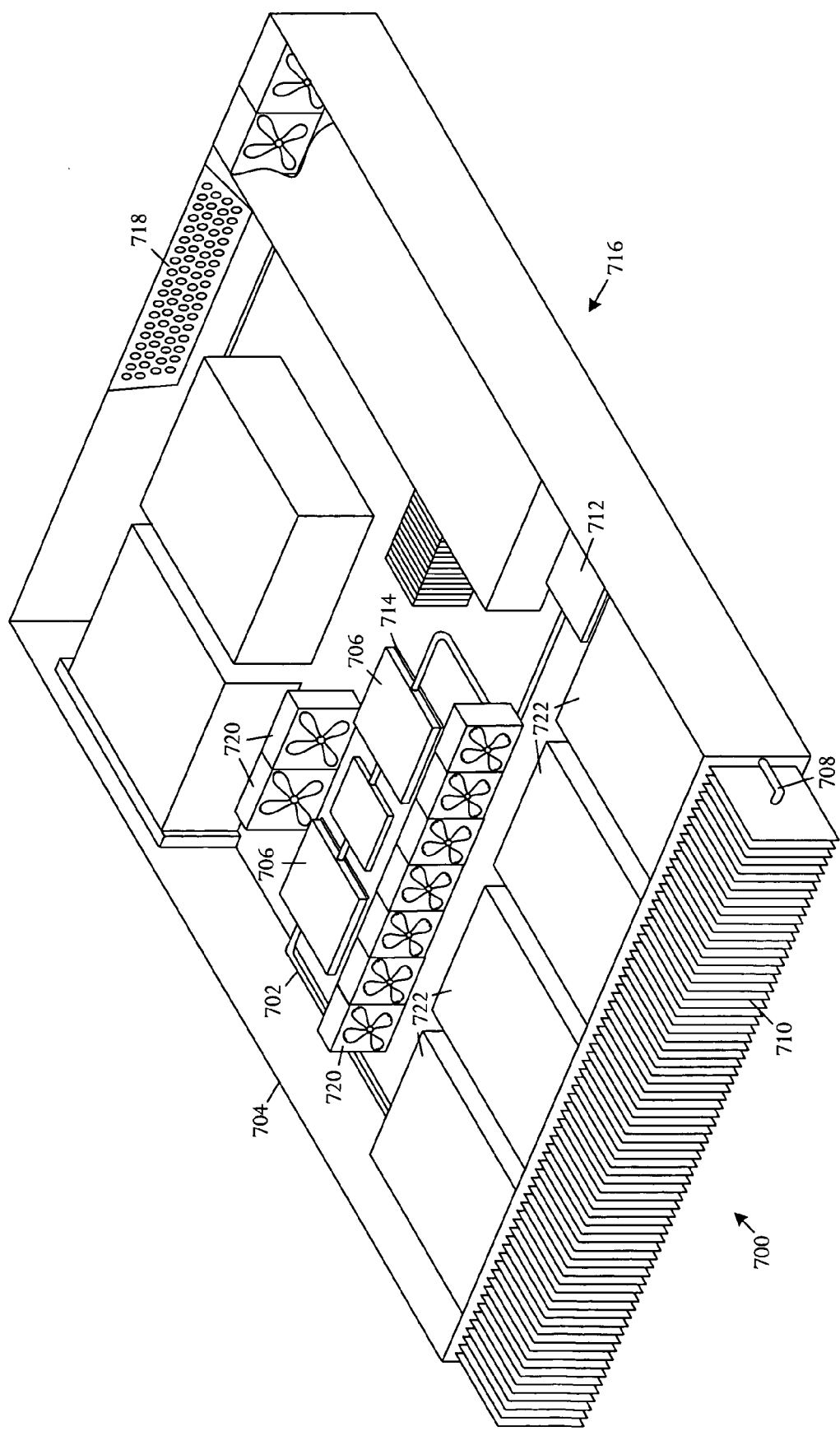
FIG. 7 is a perspective pictorial diagram that illustrates an embodiment of a liquid loop cooling system and an electronic system.

Referring to FIG. 7, a perspective pictorial diagram illustrates an embodiment of a liquid loop cooling system 700 that comprises a tubing 702 forming a loop extending through an electronic system chassis 704 interior to selectively apply cooling to interior system components 706. The tubing 702 exits the chassis 704 to form an exterior tubing segment 708 exterior to the chassis 704. The liquid loop cooling system 700 further includes a liquid loop heat exchanger 710 exterior to the chassis 704 that is coupled to the exterior tubing segment 708.

In some embodiments, the liquid loop cooling system 700 may further include a pump 712 coupled to the tubing 702 that is capable of generating a pressure head suitable to drive a cooling fluid interior to the tubing 702 through the loop interior and exterior to the chassis 704. Some embodiments may omit the pump 712. For example the fluid motion may be gravity-aided or a wick structure may be used in the tubing to drive the fluid. The liquid loop cooling system 700 also may include one or more cold plates 714 coupled to the tubing 702, typically positioned near heat-generating components 706 to supply local cooling.

The pumped liquid loop enables the heat exchanger 710 to be located relatively far from the cold plate 714. The pump 712 used for the liquid loop cooling system 700 generates a considerable pressure head, enabling the tubing 702 of the loop to be quite long so that the heat exchanger 710 can be located outside of the chassis 704. By removing the heat exchanger 710 from the chassis 704, components 706 interior to the chassis 704 can be packaged more efficiently due to the added capacity made available.

Also referring to FIG. 7, the diagram also depicts an electronic system 716 comprises the chassis 704 including airflow inlet and outlet vents 718, and fans 720 capable of circulating air from the inlet vents to the outlet vents 718. The electronic system 716 further includes a plurality of components 706 and devices such as input/output devices 722 mounted within the chassis 704 and forming local heat sources.

The electronic system 716 further includes the tubing 702 forming a loop that extends through the chassis 704 interior to selectively apply cooling to the components 706 and exits the chassis to the exterior tubing segment 708 exterior to the chassis 704. The electronic system 716 also includes the liquid loop heat exchanger 710 positioned exterior to the chassis 704 that is coupled to the exterior tubing segment 708.

In a compact electronic system 716, for example a compact server or computer system, cooling air is driven across the heat exchanger 710 using tube-axial or blower fans 720 in close proximity to the heat exchanger fins. Redundant fans 720 are typically used for electronic systems 716. In some applications, the fans 720 can be located inside the computer chassis 704, not necessarily in close proximity to the heat exchanger 710. In some embodiments, an external heat exchanger 710 located at the front of the chassis 704 may use system fans 720 inside the chassis 704 for cooling and/or additional fans added directly to the heat exchanger 710. Furthermore, an external heat exchanger 710 located in the front of the chassis 704 may receive supplemental or primary cooling air driven by fans integrated into the electronics rack. The capability of using the external heat exchanger 710 with various fan arrangements enables a high degree of flexibility in configuring a cooling capability. For example, rack-level fans can have small sizes or large sizes, as desired, to appropriately cool a rack of systems with various capacities.

For electronic systems 716 that locate the heat exchanger 710 at the front of the chassis 704, the heat exchanger 710 receives air at ambient temperature with no pre-heating that occurs due to heat generation inside the chassis, attaining a most efficient thermal performance. The heat exchanger 710 located on the front of the chassis 704 also receives additional cooling via natural convention and radiation to the environment, reducing forced-air cooling constraints.

In some embodiments the heat exchanger 710 can be adapted for mounting on an exterior surface of a compact form factor computer server chassis and be made with physical dimensions that are larger than can be contained within the chassis. Removing the heat exchanger 710 outside the chassis 704 enables the heat exchanger to be made as large as the external dimensions of the chassis 704. Otherwise, for a heat exchanger constrained to be located inside the chassis, a size limitation is imposed by the smaller physical dimensions interior to the chassis. Less efficient cooling results due to the smaller size of the heat exchanger, difficulty of installation, and proximity or conflict with other system components.

Locating the heat exchanger outside the chassis leaves more room available inside the chassis for components or to enable reduction in system size, and instead consumes exterior space that is otherwise unoccupied or occupied by a generally ornamental bezel. Furthermore, the heat exchanger can accommodate ornamental industrial design by configuration of the fins.

The liquid loop cooling system 700 can be configured by arranging the tubing 702 in a loop extending through the electronic system interior to the chassis 704 and outside the chassis 704. The liquid loop heat exchanger 710 is mounted on the exterior of the chassis 704 and the tubing loop exterior to the chassis is connected to the liquid loop heat exchanger 710.

Routing of the loop can be determined by determining the heat distribution within the electronic system chassis 704 that results from the heat-generating contribution of the plurality of components 706. The tubing loop can be arranged to extend through the chassis interior to selectively apply cooling to heat-generating components. The tubing 702 inside the chassis 704 can be connected to one or more cold plates 714 selectively positioned to cool the heat-generating components.

One or more fans 720 can be positioned to drive air through the liquid loop heat exchanger 710. The fans can be positioned interior to the chassis, exterior to the chassis, or a combination of interior and exterior to the chassis.

The tubing 702 is connected to a pump 712 to drive the cooling fluid through the loop.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, although particular geometries of the heat exchanger are shown, other arrangements are possible including multiple-pass arrangements in which additional tube segments are added. Also, particular electronic system embodiments are illustrated, for example a computer server. In other embodiments, the external heat exchanger can be employed in other types of electronic systems such as communication systems, storage systems, entertainment systems, and the like.

What is claimed is:

1. A cooling apparatus comprising:
   a tube extending in a loop interior to an electronic system chassis, through a chassis wall, and exterior to the chassis; and
   a liquid loop heat exchanger body comprising a parallel stack of closely-spaced plate fins enclosing and coupled to a portion of the loop external to the chassis and configured for attachment to an exterior surface of the chassis, wherein the tube exterior to the electronic system chassis further comprises: an inlet tube and an outlet tube coupled to the heat exchanger body; and at least one hinge coupled to at least one of the inlet tube and outlet tube enabling the heat exchanger body to be rotated away from the electronic system chassis for user and/or service access.

2. The apparatus according to claim 1 further comprising:
   the parallel stack of closely-spaced plate fins arranged in a plurality of mutually parallel planes attached to the tube segment and arranged perpendicular to the chassis exterior surface.

3. The apparatus according to claim 1 wherein:
   the heat exchanger body is adapted for mounting on an exterior surface of a compact computer server chassis and has physical dimensions that are larger than can be contained within the chassis.

4. The apparatus according to claim 1 wherein:
   edges of the parallel stack of closely-spaced plate fins of the heat exchanger body are adapted for mounting on a frontal exterior surface of the chassis.

5. The apparatus according to claim 1 further comprising:
   a tube enclosing a cooling fluid and extending in a loop that passes interiorly though the heat exchanger body external to the electronic system chassis, passes through the electronic system chassis to cooling plates coupled to electronic components interior to the electronic system chassis.

6. The apparatus according to claim 1 further comprising:
   a tube segment configured to enclose a cooling fluid and positioned interior to the heat exchanger body; and
   a plurality of fins configured in an ornamental arrangement attached to the tube segment at a frontal surface of the electronic system chassis.

7. The apparatus according to claim 1 further comprising:
   ones of the parallel stack of closely-spaced plate fins of the heat exchanger body varying in width and height along a surface of the electronic system chassis in an arrangement that enables access to indicator lights, removable input/output devices, and/or labeling.

8. The apparatus according to claim 1 further comprising:
a pump coupled to the tube and adapted to generate a pressure head suitable to drive a cooling fluid interior to the tube through the loop interior and exterior to the chassis.

9. A liquid loop cooling system comprising:
a tubing forming a loop that extends through an electronic system chassis interior to selectively apply cooling to interior system components and further exits the chassis to an exterior tubing segment exterior to the chassis; and
a liquid loop heat exchanger comprising a parallel stack of plate fins exterior to the chassis and coupled to the exterior tubing segment, wherein the exterior tubing segment further comprises: an inlet tube and an outlet tube coupled to the heat exchanger; and at least one hinge coupled to the inlet tube and outlet tube enabling the heat exchanger to be rotated away from the electronic system chassis for user and/or service access.

10. The cooling system according to claim 9 further comprising:
a pump coupled into the tubing and adapted to generate a pressure head suitable to drive a cooling fluid interior to the tubing through the loop interior and exterior to the chassis.

11. The cooling system according to claim 9 further comprising:
at least one cold plate coupled to the tubing positioned to locally cool a heat source.

12. An electronic system comprising:
a chassis including airflow inlet and outlet vents, and fans capable of circulating air from the inlet vents to the outlet vents;
a plurality of components mounted within the chassis and forming local heat sources;
a tubing forming a loop that extends through the chassis interior to selectively apply cooling to the components and further exits the chassis to an exterior tubing segment exterior to the chassis; and
a liquid loop heat exchanger comprising a parallel stack of planar plate fins exterior to the chassis, coupled to the exterior tubing segment, and arranged perpendicular to a planar surface of the chassis, at least one fan selectively positioned to drive air in an airflow pathway passing between the parallel planar plate fins in the heat exchanger; and at least one fan selectively positioned within the chassis, separated from the heat exchanger.

13. The system according to claim 12 further comprising:
a pump coupled to the tubing and adapted to pump a cooling fluid through the tubing.

14. The system according to claim 12 further comprising:
at least one cold plate coupled to the tubing and selectively positioned to cool the local heat sources.

15. The system according to claim 12 further comprising:
at least one fan coupled to the heat exchanger external to the chassis.

16. The system according to claim 12 wherein:
the heat exchanger is adapted for mounting on an exterior surface of a compact form factor computer server chassis and has physical dimensions that are larger than can be contained within the chassis.

17. A method of configuring a liquid loop cooling system in an electronic system comprising:
arranging a tubing in a loop extending through an electronic system chassis interior;
passing the tubing from the chassis interior through a chassis wall to the chassis exterior;
extending the tubing loop outside the electronic system chassis;
mounting a liquid loop heat exchanger including a plurality of mutually parallel planar plate fins on the exterior of the chassis, the mutually planar parallel plate fins being coupled to the chassis exterior perpendicular to a chassis surface; and
connecting the tubing loop outside the chassis to the liquid loop heat exchanger at a hinged connection, the tubing loop passing through and perpendicular to the mutually parallel planar plate fins; and configuring the hinged connection whereby the liquid loop heat exchanger is enabled to be rotated away from the electronic system chassis for user and/or service access.

18. The method according to claim 17 further comprising:
determining heat distribution within the electronic system chassis containing a plurality of components; and
arranging the tubing in the loop extending through an electronic system chassis interior to selectively apply cooling to heat-generating components.

19. The method according to claim 17 further comprising:
coupling the tubing interior to the chassis to at least one cold plate selectively positioned to cool the heat-generating components.

20. The method according to claim 19 further comprising:
positioning at least one fan to drive air through the liquid loop heat exchanger, the at least one fan positioned interior to the chassis, exterior to the chassis, or a combination of interior and exterior to the chassis.

21. The method according to claim 19 further comprising:
inserting a pump in the tubing loop to enable pumping of a cooling fluid through the tubing and the heat exchanger.

* * * * *